(12) United States Patent
Zhang (10) Patent No.: US 12,425,027 B2
(45) Date of Patent: Sep. 23, 2025

(54) SYSTEMS, METHODS, AND DEVICES FOR SENSOR PROTECTION CIRCUIT

(71) Applicant: Cypress Semiconductor Corporation, San Jose, CA (US)

(72) Inventor: Xiaowei Zhang, Shanghai (CN)

(73) Assignee: Cypress Semiconductor Corporation, San Jose, CA (US)

( * ) Notice: Subject to any disclaimer, the term of this patent is extended or adjusted under 35 U.S.C. 154(b) by 78 days.

(21) Appl. No.: 18/410,591

(22) Filed: Jan. 11, 2024

(65) Prior Publication Data

US 2025/0233587 A1  Jul. 17, 2025

(51) Int. Cl.
*H03K 17/96* (2006.01)
*G06F 3/044* (2006.01)

(52) U.S. Cl.
CPC ......... *H03K 17/9622* (2013.01); *G06F 3/044* (2013.01); *H03K 2217/960705* (2013.01); *H03K 2217/96071* (2013.01); *H03K 2217/960735* (2013.01)

(58) Field of Classification Search
CPC ... H03K 17/9622; H03K 2217/960705; H03K 2217/96071; H03K 2217/960735
See application file for complete search history.

(56) References Cited

U.S. PATENT DOCUMENTS

| | | | |
|---|---|---|---|
| 2003/0076307 A1* | 4/2003 | Krajewski | G06F 3/0418 345/174 |
| 2012/0200306 A1* | 8/2012 | Iwamoto | G06F 3/0447 324/658 |
| 2019/0173278 A1* | 6/2019 | Jang | H10D 89/811 |
| 2019/0371787 A1* | 12/2019 | Mandal | H10D 89/911 |
| 2020/0014380 A1* | 1/2020 | Jo | H02H 9/045 |
| 2020/0110527 A1* | 4/2020 | Jiang | G06F 3/044 |
| 2021/0305900 A1* | 9/2021 | Hosokawa | G03G 15/80 |
| 2022/0077679 A1* | 3/2022 | Farbiz | H02H 9/046 |
| 2023/0353186 A1* | 11/2023 | Chen | H03F 3/245 |
| 2024/0012515 A1* | 1/2024 | Moreno Galbis | G06F 3/0418 |
| 2024/0029589 A1* | 1/2024 | Krejcarek | G06K 1/121 |
| 2024/0055901 A1* | 2/2024 | Gu | H03H 7/1741 |
| 2025/0007279 A1* | 1/2025 | Heber | H02H 9/046 |

FOREIGN PATENT DOCUMENTS

| | | | | |
|---|---|---|---|---|
| WO | WO-2018058667 A1 * | 4/2018 | | G06F 3/041 |
| WO | WO-2019113802 A1 * | 6/2019 | | |

* cited by examiner

*Primary Examiner* — Ryan A Lubit (57) ABSTRACT

Systems, methods, and devices provide protection for sensing circuits. Methods may include providing, using a microcontroller unit (MCU), a drive signal to a touch sensor via an asymmetric conductance element of a protection circuit, providing, using the MCU, a scanning signal to the touch sensor via an additional conductance element of the protection circuit, and receiving, at the MCU, a sense signal from the touch sensor via the additional conductance element of the protection circuit. Methods also include determining, using the MCU, if a touch event has occurred based on measurements obtained during scanning of the touch sensor.

20 Claims, 6 Drawing Sheets

SYSTEMS, METHODS, AND DEVICES FOR SENSOR PROTECTION CIRCUIT

TECHNICAL FIELD

This disclosure relates to sensing circuits, and more specifically, to enhancement of protection in such sensing circuits.

BACKGROUND

Touch sensors and associated devices may be implemented in a variety of operational environments. For example, a vehicle, such as an automobile, may include such touch sensors in various locations to receive user inputs. Such touch sensors may have associated components, such as a microcontroller, that are used to process such received inputs. When implemented in such operational environments, touch sensors may be implemented adjacent to other electrical components that may have different power characteristics. For example, such adjacent electrical components may use a higher voltage power source. Conventional techniques for implemented such components in operational environments remain limited because they are not able to efficiently provide isolation and protection for the touch sensor and its associated components.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as not to unnecessarily obscure the described concepts. While some concepts will be described in conjunction with the specific examples, it will be understood that these examples are not intended to be limiting.

Touch sensors may be implemented in a variety of operational environments. More specifically, vehicles, such as automobiles, may include touch sensors for a variety of applications. For example, touch sensors may be used to sense user inputs at various locations on the automobile such as touch sensors included in a steering wheel and touch sensors included in a bumper, such as kick sensors, used to operate opening and closing of a trunk door. Such touch sensors may also be coupled to associated processing hardware, such as a microcontroller, that is configured to manage scanning and measuring of inputs received at the touch sensors.

When implemented in such environments, the touch sensors and associated processing hardware may be adjacent to other electrical circuits that have relatively high operational voltages, such as heating elements included in a steering wheel and electrical power circuits provided to rear components of the automobile, such as a trailer hitch as well as other on-board electronics. Accordingly, if a short circuit occurs and the microcontroller is not protected, the higher operational voltage of the adjacent circuits may cause damage to the microcontroller. Conventional implementations of such electrical components in such operational environments remain limited because they are not able to efficiently protect the microcontroller from overvoltages that may result from such short circuits.

Embodiments disclosed herein provide efficient isolation and protection of sensing circuits that may be implemented in a variety of operational contexts. As will be discussed in greater detail below, a voltage protection circuit may be configured to selectively pass alternating current (AC) and direct current (DC) components of signals used for scanning of a touch sensor, and may also be configured to block other signals that might not be intended for the touch sensor and its associated hardware. For example, a signal originating from a short circuit of a higher voltage circuit may be blocked and prevented from harming a microcontroller associated with the touch sensor which may have a lower operational voltage. As will also be discussed in greater detail below, one or more diodes and capacitors of the voltage protection circuit may be configured to implement such isolation and protection.

Figure 1:
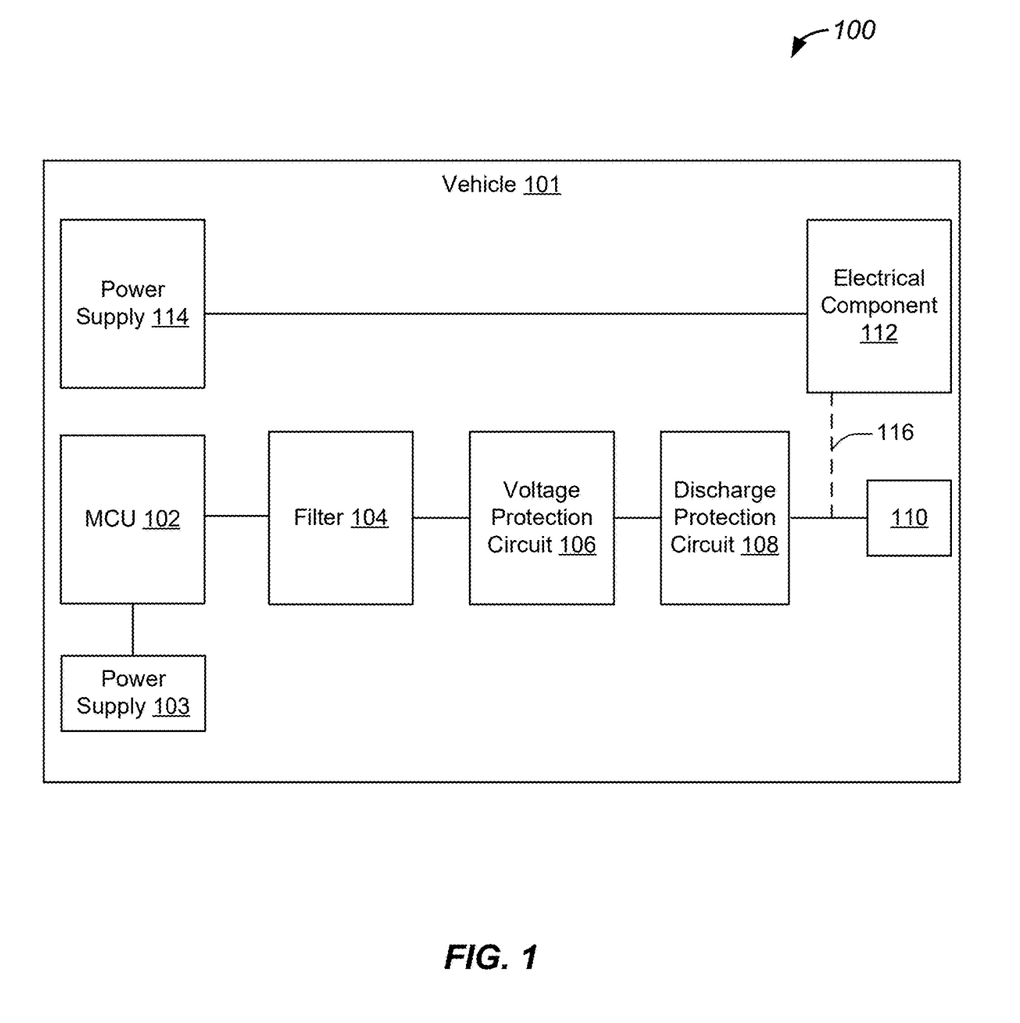
FIG. 1 illustrates an example of a system for sensing circuit protection, configured in accordance with some embodiments.

FIG. 1 illustrates an example of a system for sensing circuit protection, configured in accordance with some embodiments. As shown in system 100, multiple electrical circuits may be implemented within an operational environment, such as vehicle 101. In various embodiments, such electrical circuits may be implemented adjacent to each other, and may have different operational parameters, such as operational voltages. As will be discussed in greater detail below, embodiments disclosed herein provide isolation and protection between such electrical circuits to protect components of such electrical circuits from each other, and in a manner that efficiently uses hardware resources.

As discussed above, system 100 is implemented in an operational environment that may include multiple electrical circuits implemented in a broader operational environment, such as vehicle 101. Accordingly, multiple electrical circuits may be implemented in vehicle 101 to support different features of vehicle 101. In various embodiments, vehicle 101 may be an automobile such as a passenger car. It will be appreciated that while some embodiments are described herein with reference to automobiles, vehicle 101 may be any suitable type of vehicle.

In various embodiments, vehicle 101 includes an electrical circuit that includes power supply 114 and electrical component 112. In one example, electrical component 112 may be a heating element in a steering wheel. Accordingly, electrical component 112 may be coupled to power supply 114 which may have a designated operational voltage such as 12V, and electrical component 112 may be configured to heat various portions of the steering wheel via one or more heating elements included in electrical component 112.

Vehicle 101 may also include another electrical circuit that includes additional components, such as a processing device that includes one or more processing elements. For example, vehicle 101 includes microcontroller unit (MCU) 102 and sensing element 110. As shown in FIG. 1, MCU 102 is coupled to a power supply, such as power supply 103. In various embodiments, MCU 102 has an operational voltage that is lower than electrical component 112. In one example, MCU 102 has an operational voltage of 3.6V while electrical component 112 has an operational voltage of 12V. Accordingly, the operational voltage of electrical component 112 and power supply 114 may be substantially higher than the operational voltage of MCU 102, and may be sufficiently high to cause damage to MCU 102 in the event of a short circuit between electrical circuits that may occur between adjacent electrical components, such as electrical component 112 and sensing element 110.

In some embodiments, sensing element 110 is a capacitive touch sensor configured to detect the presence of a user input, such as a touch or hover event. Accordingly, sensing element 110 may include one or more sensing electrodes that are coupled to MCU 102. Moreover, sensing element 110 may be driven by a drive signal generated by MCU 102, and may also generate one or more measurements based on one or more sense locations of such sensing electrodes. In this way, sensing element 110 may be configured to facilitate one or more mutual capacitance and/or self-capacitance measurements.

In some embodiments, additional electrical components are implemented between MCU 102 and sensing element 110 to provide protection and electrical isolation for MCU 102 from higher voltages that may result in the event of a short circuit between electrical component 112 and sensing element 110. More specifically, system 100 includes filter 104 which is configured to filter out high frequency components of an input to MCU 102. Accordingly, high frequency components of an input signal to MCU 102 may be blocked via filter 104. System 100 additional includes discharge protection circuit 108 which is configured to shunt excess current that may result from, for example, an electrostatic discharge event. System 100 further includes voltage protection circuit 106 that is configured to block a voltage component of an input signal, which may be the result of a short circuit, while also allowing voltage components of other signals associated with sensing element 110 to pass.

As will be discussed in greater detail below, voltage protection circuit 106 is configured to block a direct current (DC) component of, for example, power supply 114 that may develop between electrical circuits, as shown in FIG. 1 by electrical path 116. Moreover, voltage protection circuit 106 may be further configured to continue to allow alternating current (AC) components of additional signals associated with sensing element 110, such as a drive signal and sensing signal. In this way, voltage protection circuit 106 may be configured to protect MCU 102 from damage from a short circuit while allowing continued operation of sensing element 110.

Figure 2:
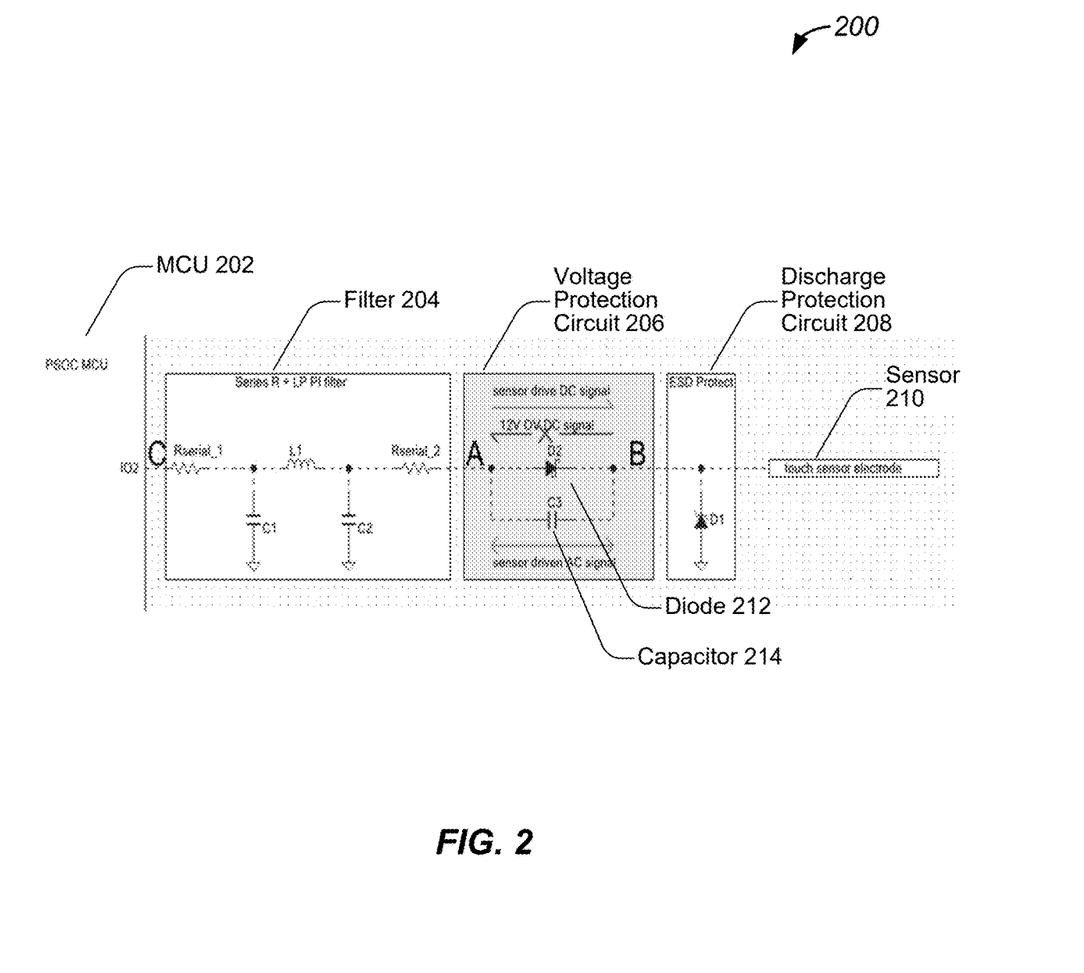
FIG. 2 illustrates an example of a device for data sensing circuit protection, configured in accordance with some embodiments.

FIG. 2 illustrates an example of a device for data sensing circuit protection, configured in accordance with some embodiments. As similarly discussed above, a device, such as device 200, may be implemented within an operational environment, such as a vehicle. As will be discussed in greater detail below, one or more components of device 200 are configured to provide isolation and protection for various sensitive components, such as MCUs, from overvoltage events, such as short circuits, in a manner that efficiently uses hardware resources.

As similarly discussed above, device 200 may include MCU 202 and sensor 210 which may include one or more sensing elements. In various embodiments, device 200 additionally includes filter 204 and discharge protection circuit 208. As also discussed above, filter 204 may be configured to filter out high frequency components of an input to MCU 202. Accordingly filter 204 may include an RLC filter circuit that is configured to have a designated cutoff frequency as may be determined by an entity, such as a manufacturer, based on operational parameters of one or more components of device 200, such as MCU 202. Thus, values of the components within the RLC filter of filter 204 may be configured based on a maximum allowed frequency of an input signal to MCU 202.

As similar discussed above, discharge protection circuit 208 may be configured to shunt excess current that may result from, for example, an electrostatic discharge event. Thus, discharge protection circuit 208 may include, for example, a Zener diode that is configured to allow current to be shunted to a circuit ground when reverse biased, as may occur in the event of an electrostatic discharge. In various embodiments, discharge protection circuit 208 may be configured such that one or more components of discharge protection circuit 208 have a breakdown voltage that is slightly higher than a drive voltage and a short-circuit voltage of sensor 210. Configuring discharge protection circuit 208 in this way prevents it from remaining in a breakdown state for an extended period and resulting in damage.

Device 200 additionally includes voltage protection circuit 206 which is configured to block a DC component of a signal that may originate from, for example, a short circuit that may occur adjacent to sensor 210. Moreover, voltage protection circuit 106 is further configured to allow alternating current (AC) components of additional signals associated with sensor 210, such as a drive signal and sensing signal. More specifically, signals may be exchanged between MCU 202 and sensor 210 to obtain mutual capacitance and/or self-capacitance measurements from electrodes included in sensor 210. Accordingly, MCU 202 may send a drive signal as well as a scanning signal to sensor 210, and in response, MCU 202 may receive a sense signal from sensor 210.

In various embodiments, the drive signal may have a DC component used to bias electrodes, and the scanning signal may have an AC component used for scanning operations. Moreover, the sense signal may have an AC component used to convey measurement information. As similarly discussed above, voltage protection circuit 206 is configured to facilitate transmission of these components of these signals while blocking extraneous signals, such as a received DC voltage that results from a short circuit. As shown in device 200, voltage protection circuit 206 includes parallel implementation of diode 212 and capacitor 214 that are configured based on performance parameters of MCU 202 and sensor 210. More specifically, diode 212 is configured to allow DC components of a signal from MCU 202 pass to sensor 210 while also blocking DC components of signals received from the electrical path coupled to sensor 210. Moreover, capacitor 214 is configured to allow AC components to pass between MCU 202 and sensor 210, while blocking DC components. In this way, voltage protection circuit 206 includes components specifically configured for each of AC and DC components of communications between MCU 202 and sensor 210. In various embodiments, voltage distortion of a drive signal provided to sensor 210 may be reduced by configuring a diode to have a low forward voltage drop, such as a Schottky diode or a germanium diode. Moreover, capacitors may be ceramic capacitors, such as NPO or X7R surface mount capacitors. In one example, the capacitors may be configured to have capacitance values 50 times the parasitic capacitance of sensor 210.

Figure 3:
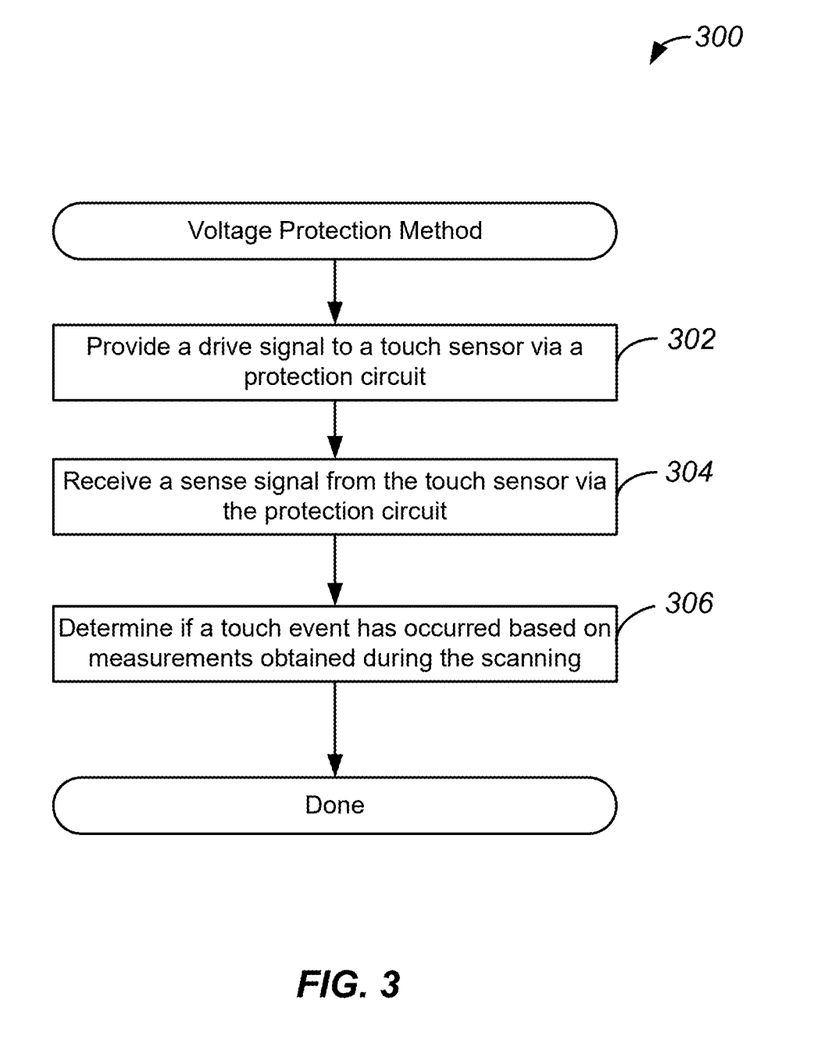
FIG. 3 illustrates an example of a method for sensing circuit protection, performed in accordance with some embodiments.

FIG. 3 illustrates an example of a method for sensing circuit protection, performed in accordance with some embodiments. As similarly discussed above, a method, such as method 300, may be performed to facilitate scanning operations for sensors within an operational environment, such as a vehicle, while providing isolation and protection for various sensitive components, such as MCUs, from overvoltage events, such as short circuits, in a manner that efficiently uses hardware resources.

Method 300 may perform operation 302 during which a drive signal may be provided to a touch sensor via a protection circuit. As similarly discussed above, the drive signal may be used to bias one or more components of the touch sensor for one or more scanning operations. For example, the drive signal may be generated by an MCU and provided to one or more transmit electrodes of the touch sensor. Moreover, the drive signal may be provided via a protection circuit implemented between the touch sensor and the MCU such that an asymmetric conductance element of the protection circuit allows the drive signal to pass to the touch sensor.

Method 300 may perform operation 304 during which a sense signal may be received from the touch sensor via the protection circuit. Accordingly, a sense signal may be detected by one or more components of the touch sensor, such as one or more sense electrodes. The sense signal may be provided from the touch sensor to the MCU via the protection circuit. In some embodiments, the protection circuit is configured to allow the sense signal to pass through the protection circuit via an additional conductance element.

Method 300 may perform operation 306 during which it may be determined if a touch event has occurred based on measurements obtained during the scanning. Accordingly, the sense signal may be received at the MCU as measurement data, and may be used to determine if a touch input or other input, such as a hover input, has been detected at the touch sensor. In some embodiments, the measurement data may be compared against one or more designated thresholds. It will be appreciated that any suitable technique for touch and/or hover detection may be used. In this way, capacitance measurements made at the touch sensor may be used to determine if a touch event or hover event has occurred.

Figure 4:
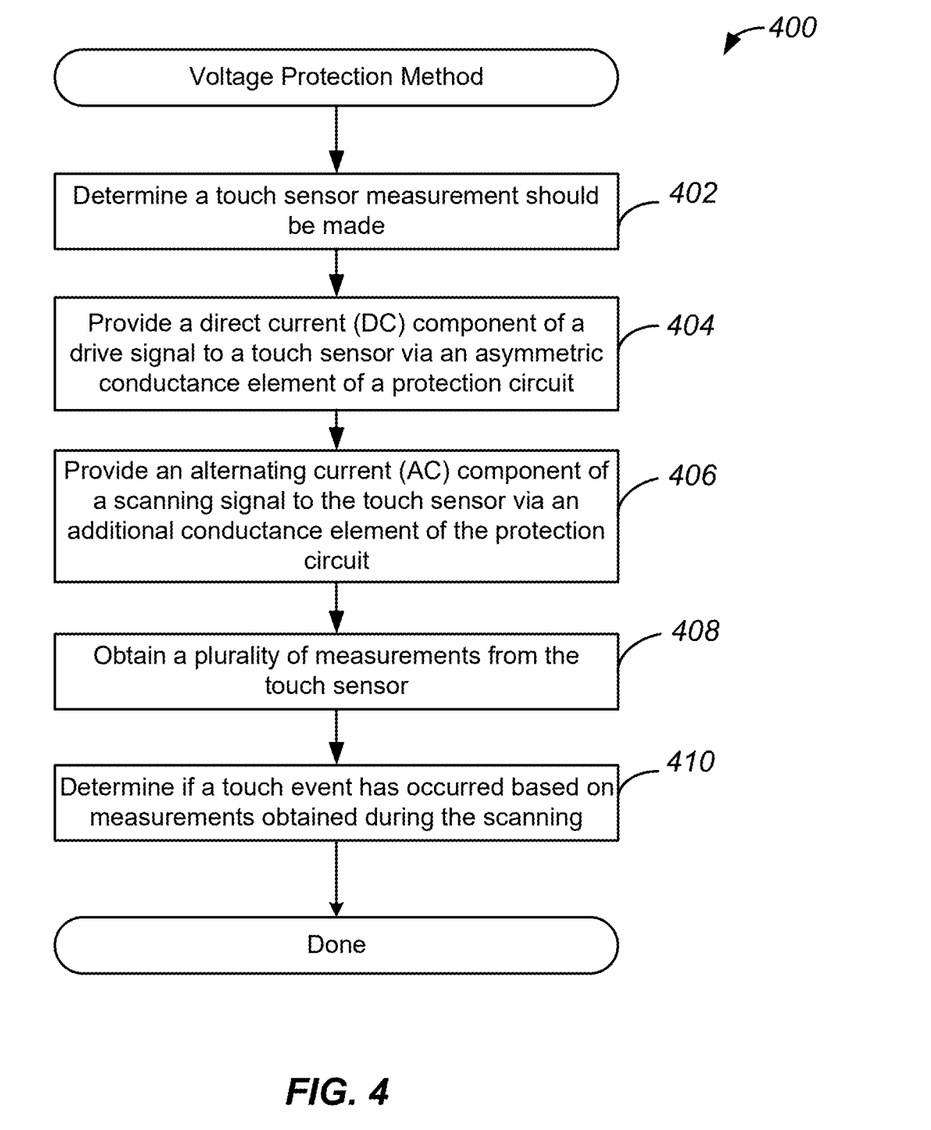
FIG. 4 illustrates another example of a method for sensing circuit protection, performed in accordance with some embodiments.

FIG. 4 illustrates another example of a method for sensing circuit protection, performed in accordance with some embodiments. As similarly discussed above, a method, such as method 400, may be performed to facilitate scanning operations for sensors within an operational environment, such as a vehicle, while providing isolation and protection for various sensitive components, such as MCUs, from overvoltage events, such as short circuits, in a manner that efficiently uses hardware resources.

Method 400 may perform operation 402 during which it may be determined that a touch sensor measurement should be made. In various embodiments, such a determination may be made based on the passage of a designated period of time. For example, the touch sensor may be periodically scanned and measurements may be periodically obtained. In some embodiments, the determination may be made responsive to a system event that may occur in an operational environment of the touch sensor. For example, a touch sensor measurement may be performed responsive to a vehicle being turned on, or in response to one or more other received inputs, such as an input received at a different sensor.

Method 400 may perform operation 404 during which a DC component of a drive signal may be provided to a touch sensor via an asymmetric conductance element of a protection circuit. As similarly discussed above, the drive signal may be used to bias one or more components of the touch sensor for one or more scanning operations. For example, the drive signal may be generated by an MCU and provided to one or more transmit electrodes of the touch sensor. Accordingly, during operation 404, the drive signal may be provided from the MCU to the touch sensor via an asymmetric conductance element included in the protection circuit. More specifically, the drive signal may forward-bias the asymmetric conductance element, which may be a diode, and in response, the asymmetric conductance element may allow a DC component of the drive signal to pass to the touch sensor. As discussed above, the diode is an asymmetric conductance element that does not allow the return of a DC component.

Method 400 may perform operation 406 during which an AC component of a scanning signal may be provided to the touch sensor via an additional conductance element of the protection circuit. Accordingly, an AC component of a signal used to scan electrodes during operation of the touch sensor may be passed through an additional conductance element of the protection circuit. For example, the additional conductance element may be a capacitor that is implemented in parallel to the asymmetric conductance element and configured as discussed above, and may allow bidirectional passage of AC components of signals between the MCU and the touch sensor. In this way, a scanning signal may be sent to the touch sensor, and a sense signal may be received from the touch sensor based.

Method 400 may perform operation 408 during which a plurality of measurements may be obtained from the touch sensor. Accordingly, as similarly discussed above, a sense signal may be detected by one or more components of the touch sensor, such as one or more sense electrodes. The sense signal may be provided from the touch sensor to the MCU via the protection circuit. More specifically, the sense signal may pass through the additional conductance element, which may be a capacitor. In this way, measurement data may be returned to the MCU.

Method 400 may perform operation 410 during which it may be determined if a touch event has occurred based on measurements obtained during the scanning. As similarly discussed above, the sense signal may be received at the MCU as measurement data, and may be used to determine if a touch input or other input, such as a hover input, has been detected at the touch sensor. In some embodiments, the measurement data may be compared against one or more designated thresholds. It will be appreciated that any suitable technique for touch and/or hover detection may be used.

Figure 5:
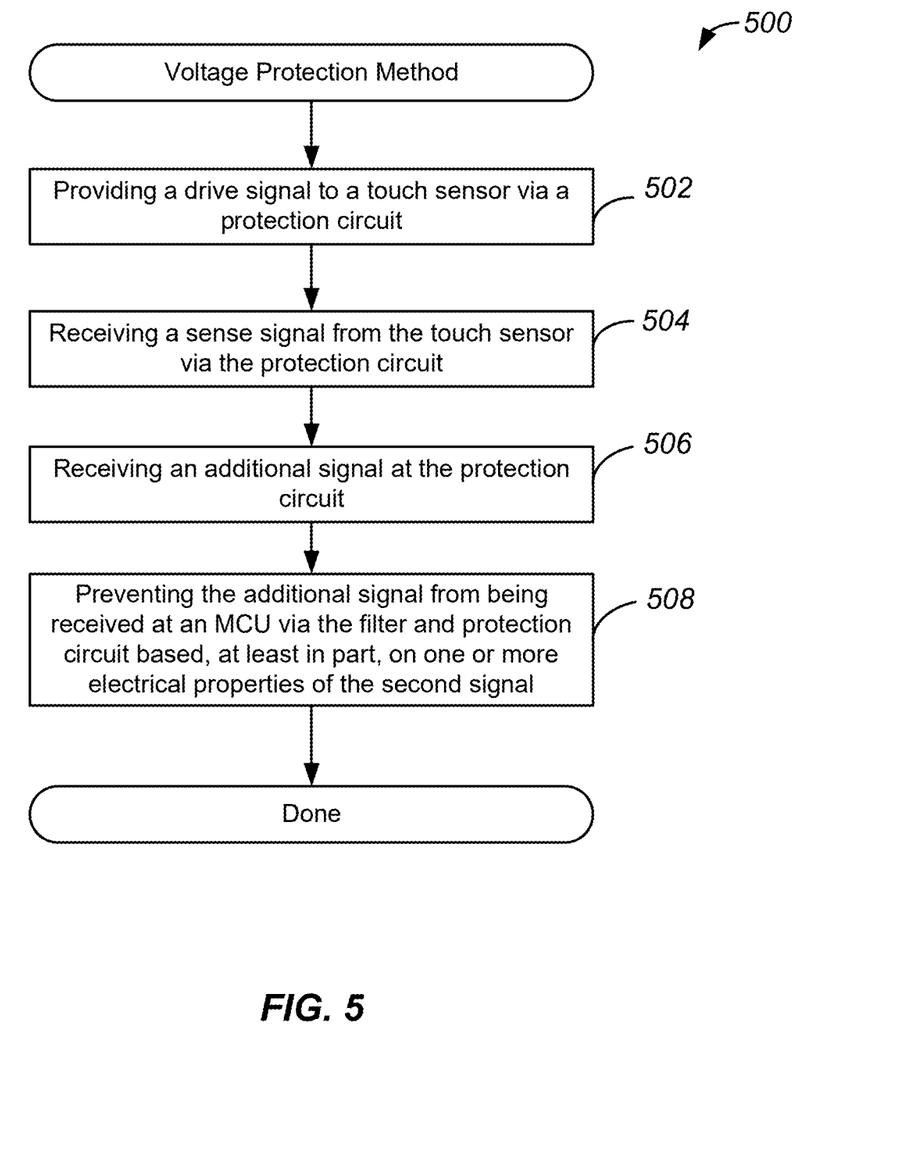
FIG. 5 illustrates an additional example of a method for sensing circuit protection, performed in accordance with some embodiments.

FIG. 5 illustrates an additional example of a method for sensing circuit protection, performed in accordance with some embodiments. As similarly discussed above, a method, such as method 500, may be performed to facilitate scanning operations for sensors within an operational environment, such as a vehicle, while providing isolation and protection for various sensitive components, such as MCUs, from overvoltage events, such as short circuits, in a manner that efficiently uses hardware resources.

Method 500 may perform operation 502 during which a drive signal may be provided to a touch sensor via a protection circuit. As similarly discussed above, the drive signal may be generated by an MCU and provided to one or more transmit electrodes of the touch sensor via an asymmetric conductance element included in the protection circuit. Thus, the asymmetric conductance element of the protection circuit allows a DC component of the drive signal to pass from the MCU to the touch sensor.

Method 500 may perform operation 504 during which a sense signal may be received from the touch sensor via the protection circuit. Accordingly, a sense signal may be detected by one or more components of the touch sensor, such as one or more sense electrodes. The sense signal may be provided from the touch sensor to the MCU via an additional conductance element of the protection circuit. As discussed above, the additional conductance element of the protection circuit is configured to allow an AC component of the sense signal to pass through the protection circuit to the MCU.

Method 500 may perform operation 506 during which an additional signal may be received at the protection circuit. In various embodiments, the additional signal may be generated by an additional entity, such as an adjacent electrical circuit. In one example, the adjacent electrical circuit may include a heating element coupled to a separate power supply. During operation, a degradation in the operational environment may occur that allows passage of current from that adjacent electrical circuit to one or more electrical pathways coupled to the touch sensor. Accordingly, the additional signal may be the result of a system event associated with the adjacent electrical circuit, such as a short circuit between the adjacent electrical circuit and the touch sensor. As will be discussed in greater detail below, the additional signal may have a DC component determined based, at least in part, on the power of the power supply of the adjacent electrical circuit. Accordingly, during operation 506, the additional signal, including its DC component, may be received at a conductive pathway coupled to the touch sensor and the protection circuit.

Method 500 may perform operation 508 during which the additional signal may be prevented from being received at the MCU via the filter and protection circuit based, at least in part, on one or more electrical properties of the second signal. In some embodiments, the electrical properties may include AC and DC components of the additional signal. As similarly discussed above, the asymmetric conductance element is configured to prevent passage of the additional signal to the MCU. For example, when the asymmetric conductance element is a diode, the additional signal will cause the diode to be reverse-biased, and the diode will not conduct. Moreover, the additional conductance element may be a capacitor that is configured to block DC components of signals. Accordingly, while a transient component may pass through the additional conductance element, the DC component will be blocked and prevented from passing to the MCU. In this way, the DC component of the additional signal that resulted from, for example, a short circuit is blocked and is prevented from harming the MCU.

Figure 6:
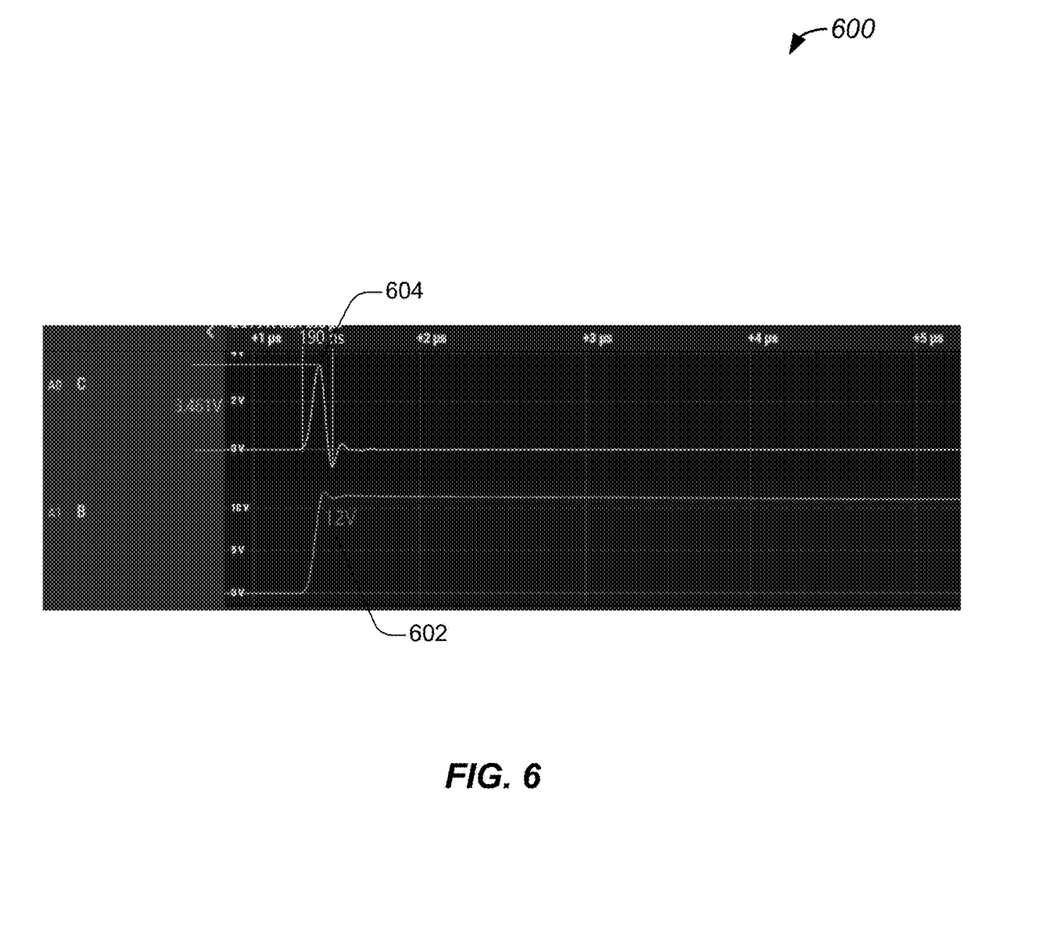
FIG. 6 illustrates an example of a diagram of a voltage protection event in accordance with some embodiments.

FIG. 6 illustrates an example of a diagram of a voltage protection event in accordance with some embodiments. Image 600 illustrates waveforms of voltages that may occur during a system event, such as a short circuit. Accordingly, first waveform 602 illustrates a voltage waveform at an input to a protection circuit, and second waveform illustrates a voltage waveform at an input of an MCU. First waveform 602 shows an input voltage at a protection circuit as initially being at 0V, but then increasing to 12V after the occurrence of the short circuit. In this example, an adjacent electrical circuit may have a power supply of 12V, and that power supply may now be shorted with a conductive pathway between the protection circuit and a touch sensor.

Second waveform 604 illustrates an output of the voltage protection circuit initially being at 0V, and then increasing to 12 V in response to the occurrence of the short circuit and the arrival of the short circuit at the protection circuit. Second waveform 604 further illustrates how the voltage returns to 0V once a transient component of the short circuit has diminished.

Third waveform 606 illustrates an input of the MCU initially being at 0V, and then increasing to 250 mV in response to the occurrence of the short circuit and the arrival of the short circuit at the protection circuit. Third waveform 606 further illustrates how the voltage does not exceed 250 mV and returns to 0V once a transient component of the second signal has diminished. Accordingly, the MCU does not receive the 12V from the short circuit and is protected from damage that may be caused by the short circuit. Moreover, the increase in voltage may be limited to 250 mV based on a configuration of one or more components of a filter, such as one or more values of resistors, as discussed above with reference to FIG. 2. It will be appreciated that while FIG. 6 illustrates a component, such as a filter, being used to attenuate an input voltage of the MCU, additional components, such as the protection circuit may be configured to perform such voltage attenuation. Accordingly, in some embodiments, an output of a protection circuit may provide a waveform as discussed with reference to third waveform 606.

Although the foregoing concepts have been described in some detail for purposes of clarity of understanding, it will be apparent that certain changes and modifications may be practiced within the scope of the appended claims. It should be noted that there are many alternative ways of implementing the processes, systems, and devices. Accordingly, the present examples are to be considered as illustrative and not restrictive.

What is claimed is:

1. A method comprising:
providing, using a microcontroller unit (MCU), a drive signal to a touch sensor via an asymmetric conductance element of a protection circuit;
providing, using the MCU, a scanning signal to the touch sensor via an additional conductance element of the protection circuit;
receiving, at the MCU, a sense signal from the touch sensor via the additional conductance element of the protection circuit; and
determining, using the MCU, if a touch event has occurred based on measurements obtained during scanning of the touch sensor.

2. The method of claim 1, wherein the asymmetric conductance element comprises a diode.

3. The method of claim 2, wherein the providing of the drive signal further comprises:
providing a direct current (DC) component of the drive signal to the touch sensor by forward-biasing the diode.

4. The method of claim 1, wherein the additional conductance element comprises a capacitor.

5. The method of claim 4, wherein the providing of the scanning signal further comprises:
providing an alternating current (AC) component of the scanning signal to the touch sensor via the capacitor.

6. The method of claim 5, wherein the receiving of the sense signal further comprises:
receiving an AC component of the sense signal at the MCU via the capacitor.

7. The method of claim 1 further comprising:
receiving, at the protection circuit, an additional signal from an adjacent electrical circuit.

8. The method of claim 7 further comprising:
preventing the additional signal from being received at the MCU based, at least in part, on one or more electrical properties of the additional signal, wherein the one or more electrical properties comprise a DC component of the additional signal.

9. The method of claim 7, wherein the additional signal is generated based on a system event comprising a short circuit.

10. A system comprising:
a touch sensor comprising a plurality of sensing elements;
a protection circuit coupled to the touch sensor, the protection circuit comprising an asymmetric conductance element and an additional conductance element; and
a microcontroller unit (MCU) configured to:
provide a drive signal to the touch sensor via the asymmetric conductance element;
provide a scanning signal to the touch sensor via the additional conductance element;
receive a sense signal from the touch sensor via the additional conductance element; and
determine if a touch event has occurred based on measurements obtained during scanning of the touch sensor.

11. The system of claim 10, wherein the asymmetric conductance element comprises a diode, and wherein the MCU is further configured to:
provide a direct current (DC) component of the drive signal to the touch sensor by forward-biasing the diode.

12. The system of claim 10, wherein the additional conductance element comprises a capacitor, and wherein the MCU is further configured to:
provide an alternating current (AC) component of the scanning signal to the touch sensor via the capacitor.

13. The system of claim 12, wherein the MCU is further configured to:
receive an AC component of the sense signal via the capacitor.

14. The system of claim 10, wherein the protection circuit is further configured to:
receive an additional signal from an adjacent electrical circuit.

15. The system of claim 14, wherein the protection circuit is further configured to:
prevent the additional signal from being received at the MCU based, at least in part, on one or more electrical properties of the additional signal, wherein the one or more electrical properties comprise a DC component of the additional signal.

16. A device comprising:
a protection circuit comprising an asymmetric conductance element and an additional conductance element; and
one or more processing elements configured to:
provide a drive signal to a touch sensor via the asymmetric conductance element;
provide a scanning signal to the touch sensor via the additional conductance element;
receive a sense signal from the touch sensor via the additional conductance element; and
determine if a touch event has occurred based on measurements obtained during scanning of the touch sensor.

17. The device of claim 16, wherein the asymmetric conductance element comprises a diode, and wherein the one or more processing elements are further configured to:
provide a direct current (DC) component of the drive signal to the touch sensor by forward-biasing the diode.

18. The device of claim 16, wherein the additional conductance element comprises a capacitor, and wherein the one or more processing elements are further configured to:
provide an alternating current (AC) component of the scanning signal to the touch sensor via the capacitor.

19. The device of claim 18, wherein the one or more processing elements are further configured to:
receive an AC component of the sense signal via the capacitor.

20. The device of claim 16, wherein the protection circuit is further configured to:
receive an additional signal from an adjacent electrical circuit; and
prevent the additional signal from being received at the one or more processing elements based, at least in part, on one or more electrical properties of the additional signal, wherein the one or more electrical properties comprise a DC component of the additional signal.

* * * * *